United States Patent
Ruan et al.

(10) Patent No.: US 11,814,716 B2
(45) Date of Patent: Nov. 14, 2023

(54) FACEPLATE HAVING BLOCKED CENTER HOLE

(71) Applicant: Applied Materials, Inc., Santa Clara, CA (US)

(72) Inventors: Fang Ruan, Milpitas, CA (US); Prashant Kumar Kulshreshtha, San Jose, CA (US); Jiheng Zhao, San Jose, CA (US); Diwakar Kedlaya, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 576 days.

(21) Appl. No.: 16/698,448

(22) Filed: Nov. 27, 2019

(65) Prior Publication Data

US 2021/0156028 A1 May 27, 2021

(51) Int. Cl.
*C23C 16/455* (2006.01)
*H01J 37/32* (2006.01)
*H01L 21/3213* (2006.01)

(52) U.S. Cl.
CPC .. *C23C 16/45565* (2013.01); *H01J 37/32449* (2013.01); *H01J 37/32633* (2013.01); *H01L 21/32136* (2013.01)

(58) Field of Classification Search
CPC ............. C23C 16/45565; C23C 16/505; H01J 37/32449; H01J 37/3244; H01J 37/32633; H01L 21/32136
See application file for complete search history.

(56) References Cited

U.S. PATENT DOCUMENTS

| | | | | |
|---|---|---|---|---|
| 5,968,275 A | * | 10/1999 | Lee ................... | H01J 37/32633 438/731 |
| 2006/0219361 A1 | * | 10/2006 | Wang ................ | H01J 37/32357 156/345.33 |
| 2011/0073038 A1 | * | 3/2011 | Chien ............... | C23C 16/45565 118/715 |
| 2015/0136028 A1 | * | 5/2015 | Park .................. | C23C 16/45519 118/730 |
| 2017/0178867 A1 | * | 6/2017 | Kudela ............... | H01J 37/3244 |
| 2021/0332480 A1 | * | 10/2021 | Zhang ............... | C23C 16/45565 |

* cited by examiner

*Primary Examiner* — Aiden Lee
(74) *Attorney, Agent, or Firm* — Kilpatrick Townsend & Stockton LLP (57) ABSTRACT

Exemplary semiconductor processing chambers may include a gasbox. The chambers may include a substrate support. The chambers may include a blocker plate positioned between the gasbox and the substrate support. The blocker plate may define a plurality of apertures through the plate. The chambers may include a faceplate positioned between the blocker plate and substrate support. The faceplate may be characterized by a first surface facing the blocker plate and a second surface opposite the first surface. The second surface of the faceplate and the substrate support may at least partially define a processing region within the semiconductor processing chamber. The faceplate may be characterized by a central axis, and the faceplate may define a plurality of apertures through the faceplate. The faceplate may define a central recess about the central axis extending from the second surface of the faceplate to a depth less than a thickness of the faceplate.

17 Claims, 4 Drawing Sheets

FACEPLATE HAVING BLOCKED CENTER HOLE

TECHNICAL FIELD

The present technology relates to components and apparatuses for semiconductor manufacturing. More specifically, the present technology relates to processing chamber distribution components and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

SUMMARY

Exemplary semiconductor processing chambers may include a gasbox. The chambers may include a substrate support. The chambers may include a blocker plate positioned between the gasbox and the substrate support. The blocker plate may define a plurality of apertures through the blocker plate. The chambers may include a faceplate positioned between the blocker plate and the substrate support. The faceplate may be characterized by a first surface facing the blocker plate and a second surface opposite the first surface. The second surface of the faceplate and the substrate support may at least partially define a processing region within the semiconductor processing chamber. The faceplate may be characterized by a central axis, and the faceplate may define a plurality of apertures through the faceplate. The faceplate may define a central recess about the central axis extending from the second surface of the faceplate to a depth less than a thickness of the faceplate.

In some embodiments, the faceplate may be substantially planar across the first surface of the faceplate about the central axis. The chambers may include an electrical source configured to strike a plasma within the processing region of the semiconductor processing chamber. Each aperture of the plurality of apertures may be include an aperture profile characterized by a first section extending from the first surface of the faceplate partially through the faceplate, and may be further characterized by a second section extending from a position partially through the faceplate to the second surface of the faceplate. The first section may be characterized by a substantially cylindrical profile. The second section may include a conical or countersunk profile. The central recess may be characterized by a similar profile as the second section of the aperture profile of each aperture of the plurality of apertures. The central recess may extend less than halfway through a thickness of the faceplate from the second surface of the faceplate.

Some embodiments of the present technology may encompass semiconductor processing chamber faceplates. The faceplates may include a first surface and a second surface opposite the first surface. The faceplate may be characterized by a central axis extending through the first surface and the second surface. The faceplates may define a plurality of apertures through the faceplate. The faceplates may define a central recess along the central axis and extending from the second surface of the faceplate to a depth less than a thickness of the faceplate.

In some embodiments, the faceplate may be substantially planar across the first surface of the faceplate about the central axis. Each aperture of the plurality of apertures may extend from the first surface of the faceplate to the second surface of the faceplate. A profile of each aperture may include a taper extending from the second surface of the faceplate. The taper may extend to a depth partway through a depth of the faceplate, and the profile of each aperture may transition to a choke from the taper. The profile of each aperture may transition from the choke to a substantially cylindrical profile extending to the first surface of the faceplate. The central recess may be characterized by a profile identical to the taper of the profile of each aperture of the plurality of apertures. The central recess profile may transition to a substantially cylindrical profile extending to a location less than the thickness of the faceplate. The central recess may be blocked from providing fluid access through the faceplate at the first surface of the faceplate. The central recess may extend less than halfway through a thickness of the faceplate from the second surface of the faceplate.

Some embodiments of the present technology may encompass methods of semiconductor processing. The methods may include flowing a precursor into a processing chamber. The processing chamber may include a faceplate and a substrate support on which a substrate is disposed. A processing region of the processing chamber may be at least partially defined between the faceplate and the substrate support. The faceplate may define a plurality of apertures through which the precursor flows. The faceplate may define a central recess along a central axis of the faceplate. The central recess may extend from a surface of the faceplate facing the substrate support to a depth less than a thickness of the faceplate. The methods may include generating a plasma of the precursor within the processing region of the processing chamber. The methods may include depositing a material on the substrate.

In some embodiments, the material deposited may be characterized by thickness at a center of the substrate less than 10% greater than a thickness proximate an edge of the substrate. The central recess may be characterized by a conical or countersunk profile.

Such technology may provide numerous benefits over conventional systems and techniques. For example, embodiments of the present technology may allow controlled deposition at a central region of a substrate. Additionally, the components may maintain central plasma generation to reduce effects on plasma density and distribution. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. The precursors may be distributed through one or more components within the chamber, which may produce a radial or lateral distribution of delivery to provide increased formation or removal at the substrate surface.

As device features reduce in size, tolerances across a substrate surface may be reduced, and material property differences across a film may affect device realization and uniformity. Many chambers include a characteristic process signature, which may produce non-uniformity across a substrate. Temperature differences, flow pattern uniformity, and other aspects of processing may impact the films on the substrate, creating film uniformity differences across the substrate for materials produced or removed. For example, one or more devices may be included within a processing chamber for delivering and distributing precursors within a processing chamber. A blocker plate may be included in a chamber to provide a choke in precursor flow, which may increase residence time at the blocker plate and lateral or radial distribution of precursors. A faceplate may further improve uniformity of delivery into a processing region, which may improve deposition or etching.

In some non-limiting examples of deposition processes, precursor flow rate may impact operation based on the film being formed. For example, while some processes may actually lower deposition rates by increasing some precursor flows, other processes may have a proportional increase in deposition rate with increased precursor flow rates across a wide range. Consequently, to increase throughput, some deposition processes may be characterized by precursor delivery rates of greater than or about 5 L/min, greater than or about 7 L/min, greater than or about 10 L/min, or greater. To accommodate these increased rates, some blocker plate designs may be characterized by increased conductance, such as by increasing the number or size of apertures, which may facilitate cleaning operations and allow increased precursor delivery rates. However, this may affect the blocking function of the plate, and precursor delivery may be increased, such as with an increased central delivery, depending on the chamber inlet. This flow profile may continue through the faceplate and into the processing region, which may result in increased deposition in a center area of the substrate, which may develop a center peak deposition profile.

The present technology overcomes these challenges during these higher delivery rate processes, as well as for any other process that may produce a center peak formation. By utilizing one or more chamber components that may alter a flow path through the processing chamber, increased control of the film formation may be afforded. Accordingly, the present technology may produce improved film deposition characterized by improved uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

Figure 1:
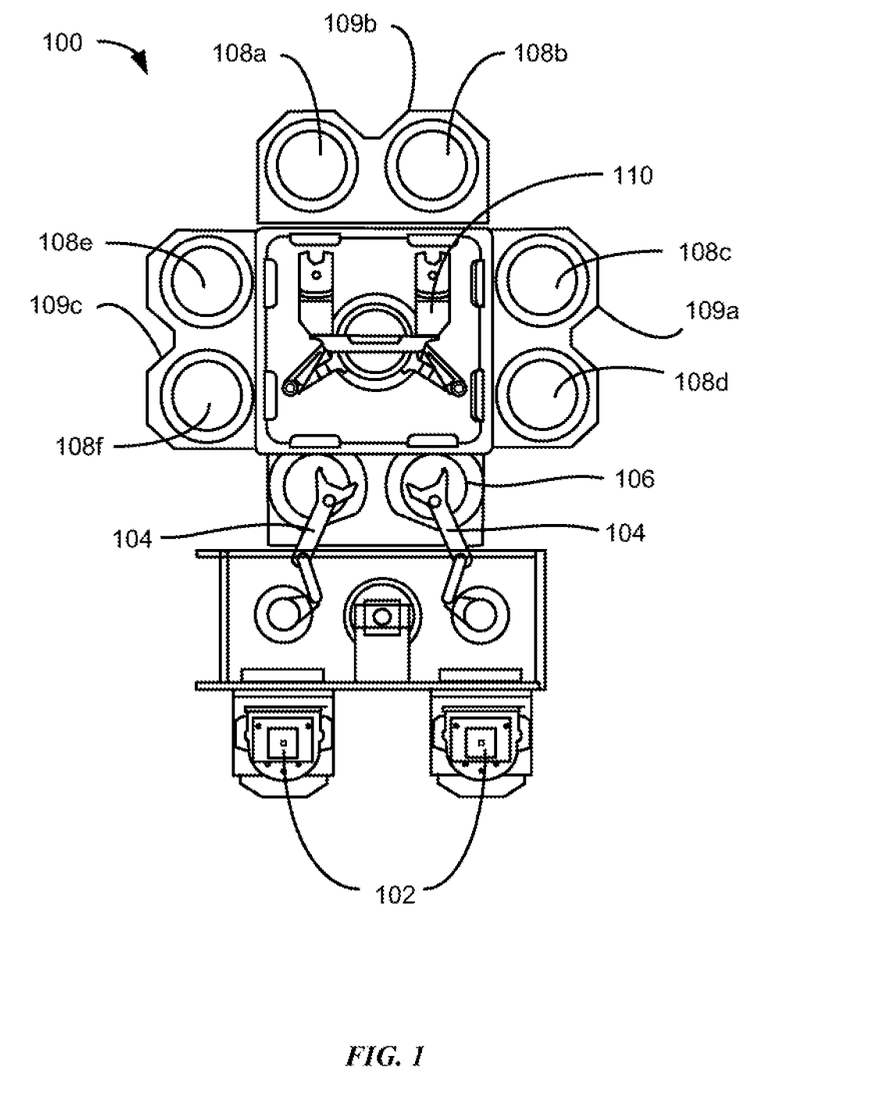
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
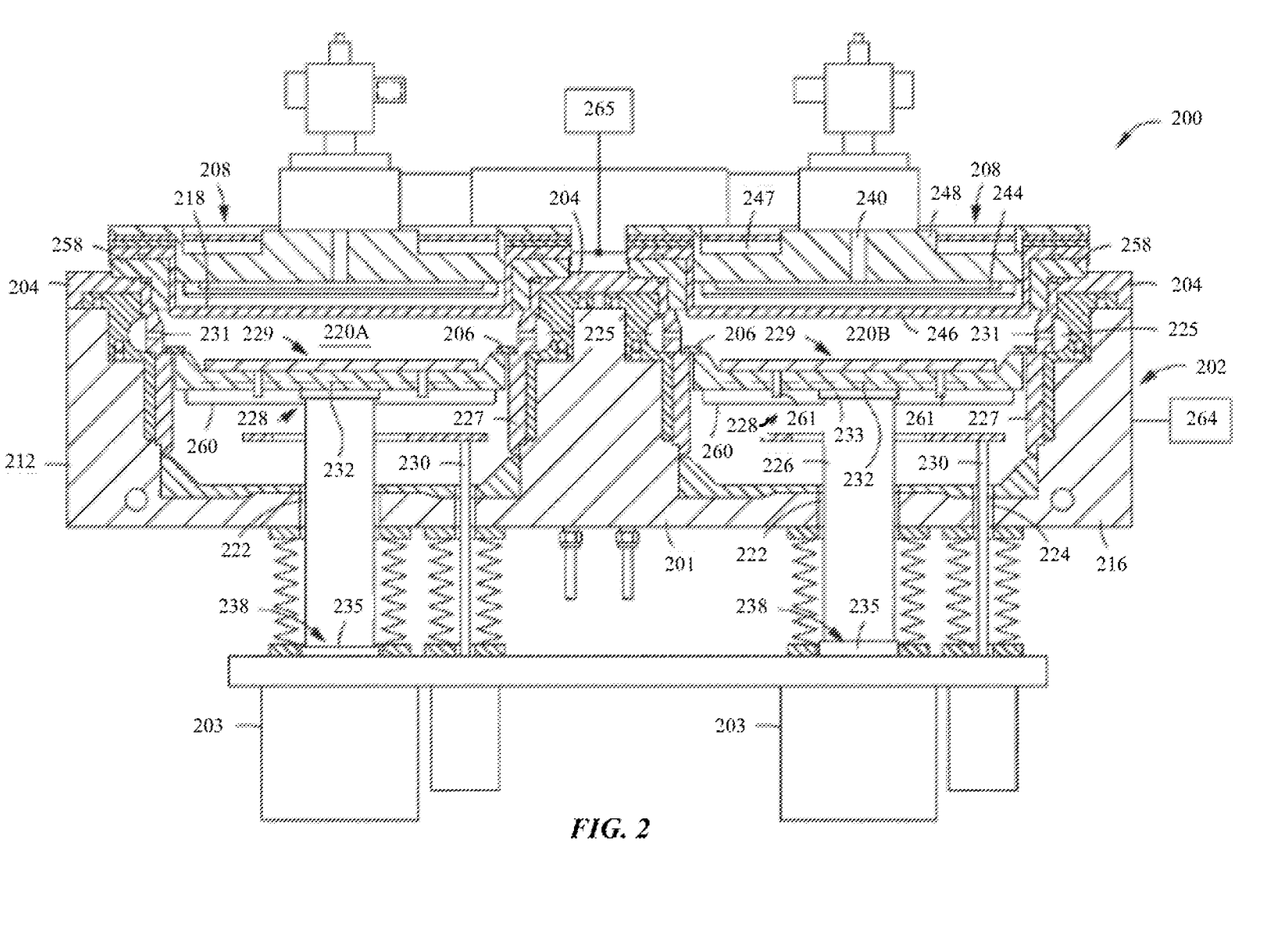
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
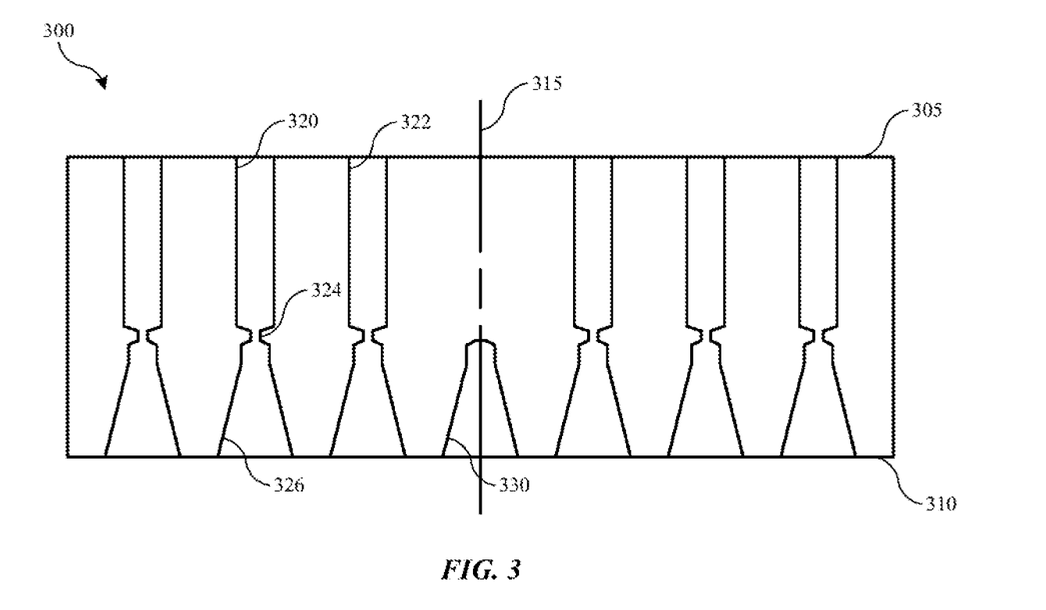
FIG. 3 shows a schematic partial cross-sectional view of an exemplary faceplate according to some embodiments of the present technology.

FIG. 3 shows a schematic partial cross-sectional view of an exemplary faceplate 300 according to some embodiments of the present technology. FIG. 3 may illustrate further details relating to components in system 200, such as for faceplate 246. Faceplate 300 is understood to include any feature or aspect of system 200 discussed previously in some embodiments. The faceplate 300 may be used to perform semiconductor processing operations including deposition of hardmask materials as previously described, as well as other deposition, removal, and cleaning operations. Faceplate 300 may show a partial view of a faceplate that may be incorporated in a semiconductor processing system, and may illustrate a view across a center of the faceplate, which may otherwise be of any size, and include any number of apertures.

As noted, faceplate 300 may be included in any number of processing chambers, including system 200 described above. Faceplate 300 may be included as part of the gas inlet assembly, such as with a gasbox and blocker plate. For example, a gasbox may define or provide access into a processing chamber. A substrate support may be included within the chamber, and may be configured to support a substrate for processing. A blocker plate may be included in the chamber between the gasbox and the substrate support. The blocker plate may include or define a number of apertures through the plate. The components may include any of the features described previously for similar components, as well as a variety of other modifications similarly encompassed by the present technology.

Faceplate 300 may be positioned within the chamber between the blocker plate and the substrate support as illustrated previously. Faceplate 300 may be characterized by a first surface 305 and a second surface 310, which may be opposite the first surface. In some embodiments, first surface 305 may be facing towards a blocker plate, gasbox, or gas inlet into the processing chamber. Second surface 310 may be positioned to face a substrate support or substrate within a processing region of a processing chamber. For example, in some embodiments, the second surface 310 of the faceplate and the substrate support may at least partially define a processing region within the chamber. Faceplate 300 may be characterized by a central axis 315, which may extend vertically through a midpoint of the faceplate, and may be coaxial with a central axis through the processing chamber.

Faceplate 300 may define a plurality of apertures 320 defined through the faceplate and extending from the first surface through the second surface. Each aperture 320 may provide a fluid path through the faceplate, and the apertures may provide fluid access to the processing region of the chamber. Depending on the size of the faceplate, and the size of the apertures, faceplate 300 may define any number of apertures through the plate, such as greater than or about 1,000 apertures, greater than or about 2,000 apertures, greater than or about 3,000 apertures, greater than or about 4,000 apertures, greater than or about 5,000 apertures, greater than or about 6,000 apertures, or more. The apertures may have a uniform or staggered spacing, and may be spaced apart at less than or about 10 mm from center to center. The apertures may also be spaced apart at less than or about 9 mm, less than or about 8 mm, less than or about 7 mm, less than or about 6 mm, less than or about 5 mm, less than or about 4 mm, less than or about 3 mm, or less.

Each aperture of the plurality of apertures may be characterized by an aperture profile, which may be any number of variations. The apertures may include any profile or number of sections having different profiles. In some embodiments, the faceplates may have at least two sections, at least 3 sections, at least 4 sections, at least 5 sections, or more, defining different profiles through the aperture. In one non-limiting example as illustrated, each aperture of the plurality of apertures may include an aperture profile including at least three sections. For example, first section 322 may extend from the first surface 305 of the faceplate, and may extend partially through the faceplate. In some embodiments the first section 322 may extend at least about or greater than halfway through a thickness of the faceplate between first surface 305 and second surface 310. First section 322 may be characterized by a substantially cylindrical profile as illustrated. By substantially is meant that the profile may be characterized by a cylindrical profile, but may account for machining tolerances and parts variations, as well as a certain margin of error.

The first section 322 may transition to an optional second section 324, which may operate as a choke in the faceplate, and may increase distribution or uniformity of flow. As illustrated, the section may include a taper from first section 322 to a narrower diameter. The section may then flare to a third section 326. Third section 326 may extend from a position partially through the faceplate to the second surface 310. Third section 326 may extend less than halfway through the thickness of the faceplate, for example, or may extend up to or about halfway through the faceplate. Third section 326 may be characterized by a tapered profile from the second surface in some embodiments, and may extend to include a cylindrical portion intersecting a flare from second section 324, when included. Third section 326 may be characterized by a conical profile in some embodiments, or may be characterized by a countersunk profile, among other tapered profiles.

Along the central axis, such as concentric with the central axis, for example, may be defined a central recess 330. Central recess 330 may be a blocked or blind hole in some embodiments, which may not provide fluid access through the faceplate. Central recess 330 may extend from the second surface of the faceplate to a depth less than a thickness of the faceplate. For example, the central recess may be characterized by a profile similar or identical to the third portion of each aperture of the plurality of apertures. The central recess may extend less than halfway through a thickness of the faceplate from the second surface of the faceplate. The central recess may be characterized by a taper from the second surface to a cylindrical portion extending to a blocked portion or ending partially through the faceplate. The first surface 305 of the faceplate may be substantially planar across the central area, such as across an area where the central recess would otherwise extend. For example, no cylindrical portion may be included for an aperture along the central axis from the first surface of the faceplate.

Figure 4A:
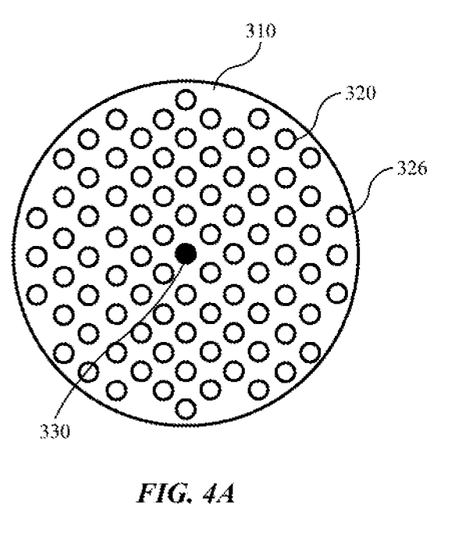
FIG. 4A shows a schematic bottom plan view of an exemplary faceplate according to some embodiments of the present technology.

FIG. 4A shows a schematic bottom plan view of an exemplary faceplate according to some embodiments of the present technology, and may illustrate a schematic view of faceplate 300, for example, such as along second surface 310. As illustrated, faceplate 300 may include a plurality of apertures 320. It is to be understood that the figure is simply for illustrative purposes, and encompassed faceplates may be characterized by hundreds or thousands of apertures as noted previously. Along second surface 310, apertures 320 may show third section 326, for example. The apertures may all illustrate a channel extending through the faceplate except at a midpoint of the faceplate, where central recess 330 may be located. The recess may appear as a blind hole or blocked because central recess 330 may not allow fluid passage through the faceplate.

Figure 4B:
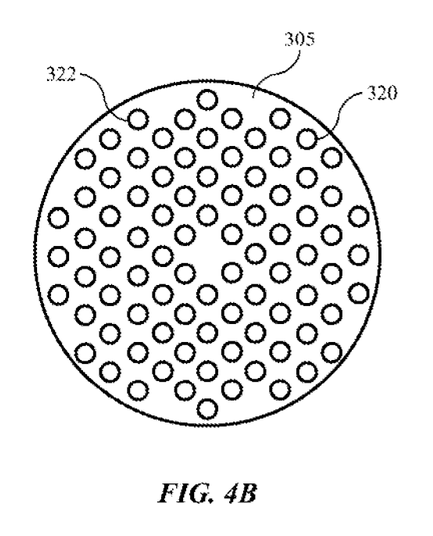
FIG. 4B shows a schematic top plan view of an exemplary faceplate according to some embodiments of the present technology.

FIG. 4B shows a schematic top plan view of an exemplary faceplate according to some embodiments of the present technology, and may illustrate a schematic view of faceplate 300, for example, such as along first surface 305. As illustrated, faceplate 300 may include a plurality of apertures 320, and again may include thousands of apertures for faceplates encompassed by the present technology. Along first surface 305, apertures 320 may show first section 322, for example. The apertures may all illustrate a channel extending through the faceplate except at a midpoint of the faceplate, where central recess 330 may be located on the opposite side of the plate. As shown, in some embodiments the midpoint of the faceplate on first surface 305 may be blank, and may be substantially planar or planar across the area. By including a blank space at the midpoint, flow through the central region of the faceplate may be better dispersed radially to apertures located further outward.

As discussed previously, in some embodiments, faceplate 300 may be included in a processing chamber configured to perform methods of deposition, etch, or other processes where a center profile may not be uniform. For example, in an exemplary deposition process, the substrate may be characterized by a center peak deposition, where additional material may deposit at a central location on the substrate. As discussed above, a number of conditions and configurations may contribute to this effect. In one non-limiting example, higher conductance blocker plates may allow an increased center flow of precursors through the chamber. Consequently, although the apertures of the faceplate may at least partially mitigate this effect, the increased flow may carry through the faceplate providing more material at the center region for deposition when a plasma is generated.

By removing a center hole, deposition at a central region may be reduced, even with adjacent holes within less than or about 10 mm, less than or about 8 mm, less than or about 6 mm, less than or about 4 mm, or less. However, when the hole is removed from the plasma-facing side of the faceplate, the blank surface may affect the plasma being formed. For example, the third section of each aperture may provide a hollow cathode effect, which may increase current density within the area, improving ionization and plasma density within the adjacent portion of the processing region. When a blank is included in the second surface, the region includes reduced surface area, as well as a reduced surface profile. This may lower ionization relative to other areas. Consequently, plasma generation in the area may be affected, which may further reduce material deposition at the substrate surface.

Figure 5:
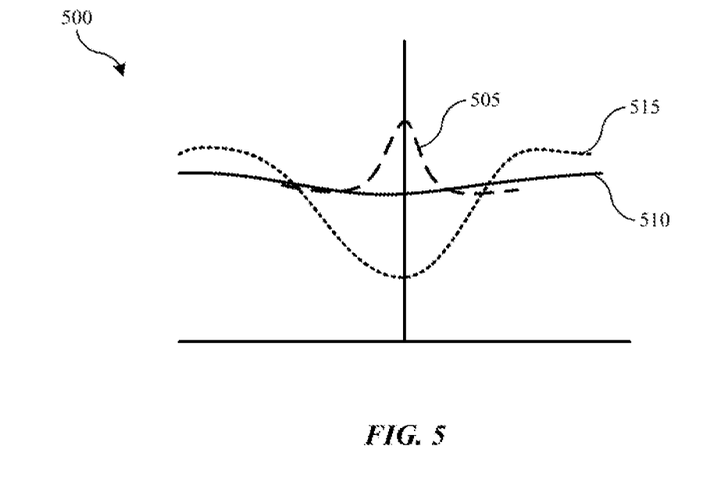
FIG. 5 shows a chart illustrating deposition effects for different faceplates according to some embodiments of the present technology.

FIG. 5 shows a chart 500 illustrating deposition effects across a portion of a substrate for different faceplates according to some embodiments of the present technology. The vertical axis illustrated may be the center of a substrate, and the horizontal axis may include radial locations across the substrate. Dashed line 505 may illustrate a deposition profile across a substrate for a faceplate including a center hole similar to all other apertures through the faceplate. As illustrated, a center peak of material or increased deposition occurs at the center of the substrate. When fluid access is prevented at the center, while maintaining a recess on the second surface of the faceplate, solid line 510 was produced. Although adjacent apertures were located within 5 mm of the central aperture, by blocking only the fluid passage of the central aperture, the material deposition was improved across a region of the substrate of at least about 10 mm in diameter. Dashed line 515 may illustrate a deposition profile across a substrate for a faceplate where neither a central aperture nor a central recess may be included. As shown, at the center of the substrate, a depression was formed, which was characteristic of a low point of deposition on the substrate, and which may be the result of reduced plasma effects in the associated region proximate the showerhead, where no aperture was included.

Accordingly, by maintaining the central recess on the second surface of the faceplate directly center on the faceplate, while maintaining apertures at adjacent locations, including at all other aperture locations across the faceplate, deposition profiles were improved. Non-uniformity of deposition may be the difference between the highest and lowest locations of deposition. By utilizing faceplates according to embodiments of the present technology, non-uniformity may be reduced by greater than or about 0.5% compared to faceplates having a central aperture, or no recess at either side of the faceplate, and non-uniformity may be reduced by greater than or about 1.0%, greater than or about 1.5%, greater than or about 2.0%, greater than or about 2.5%, or greater depending on the thickness of deposition or other deposition conditions.

Figure 6:
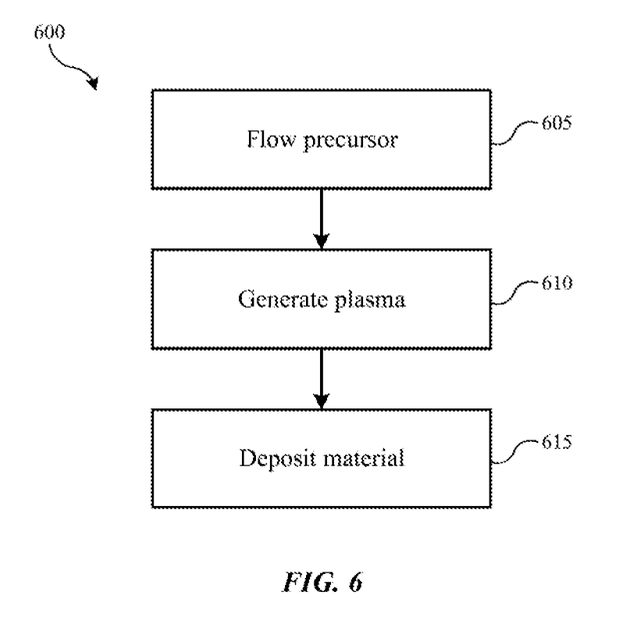
FIG. 6 shows operations of an exemplary method of semiconductor processing according to some embodiments of the present technology.

FIG. 6 shows operations of an exemplary method 600 of semiconductor processing according to some embodiments of the present technology. The method may be performed in a variety of processing chambers, including processing system 200 described above, which may include faceplates according to embodiments of the present technology, such as faceplate 300. Method 600 may include a number of optional operations, which may or may not be specifically associated with some embodiments of methods according to the present technology.

Method 600 may include a processing method that may include operations for forming a hardmask film or other deposition operations. The method may include optional operations prior to initiation of method 600, or the method may include additional operations. For example, method 600 may include operations performed in different orders than illustrated. In some embodiments, method 600 may include flowing one or more precursors into a processing chamber at operation 605. For example, the precursor may be flowed into a chamber, such as included in system 200, and may flow the precursor through one or more of a gasbox, a blocker plate, or a faceplate, prior to delivering the precursor into a processing region of the chamber.

In some embodiments, the faceplate may have a blocked access at a center of the faceplate along a first surface, and a blind recess in a second surface opposite the first, and which may be facing the processing region. Any of the other characteristics of faceplates described previously may also be included, including any aspect of faceplate 300, such as that a center recess may be characterized by a conical or countersunk profile. At operation 610, a plasma may be generated of the precursors within the processing region, such as by providing RF power to the faceplate to generate a plasma. Material formed in the plasma may be deposited on the substrate at operation 615. In some embodiments, depending on the thickness of the material deposited, the deposited material may be characterized by a thickness at the center of the substrate that is less than or about 10% greater than a thickness proximate a mid or edge region along a radius of the substrate.

Additionally, the thickness at the center of the substrate may be less than or about 9% greater than a thickness proximate a mid or edge region along a radius of the substrate, and may be less than or about 8% greater, less than or about 7% greater, less than or about 6% greater, less than or about 5% greater, less than or about 4% greater, less than or about 3% greater, less than or about 2% greater, less than or about 1% greater, or may be substantially similar or uniform across positions along the substrate. By utilizing a showerhead including a blind hole at a center of a faceplate, while not providing fluid access through an aperture extending through the faceplate along a central axis, improved uniformity may be provided.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a gasbox;
a substrate support;
a blocker plate positioned between the gasbox and the substrate support, wherein the blocker plate defines a plurality of blocker plate apertures through the blocker plate; and
a faceplate positioned between the blocker plate and the substrate support, wherein the faceplate is characterized by a first surface facing the blocker plate and a second surface opposite the first surface, wherein the second surface of the faceplate and the substrate support at least partially define a processing region within the semiconductor processing chamber, wherein the faceplate is characterized by a central axis, wherein the faceplate defines a plurality of faceplate apertures through the faceplate, wherein the faceplate defines a central recess about the central axis extending from the second surface of the faceplate to a depth less than a thickness of the faceplate, and
wherein the central recess defines a blind hole, and
wherein each faceplate aperture comprises an aperture profile characterized by a first section extending from the first surface to a position partially through the faceplate, and further characterized by a second section extending from the position partially through the faceplate to the second surface, wherein the central recess is characterized by a substantially identical profile as the second section of the aperture profile of each faceplate aperture.

2. The semiconductor processing chamber of claim 1, wherein the faceplate is substantially planar across the first surface about the central axis.

3. The semiconductor processing chamber of claim 1, further comprising an electrical source configured to strike a plasma within the processing region of the semiconductor processing chamber.

4. The semiconductor processing chamber of claim 1, wherein the first section is characterized by a substantially cylindrical profile.

5. The semiconductor processing chamber of claim 1, wherein the second section comprises a conical or countersunk profile.

6. The semiconductor processing chamber of claim 1, wherein the central recess extends less than halfway through the thickness of the faceplate from the second surface.

7. A semiconductor processing chamber faceplate, comprising:
a first surface and a second surface opposite the first surface, wherein:
the faceplate is characterized by a central axis extending through the first surface and the second surface,
the faceplate defines a plurality of faceplate apertures through the faceplate, and
the faceplate defines a central recess along the central axis and extending from the second surface of the faceplate to a depth less than a thickness of the faceplate; and
wherein the central recess defines a blind hole, and
wherein each faceplate aperture comprises an aperture profile characterized by a first section extending from the first surface to a position partially through the faceplate, and further characterized by a second section extending from the position partially through the faceplate to the second surface, wherein the central recess is characterized by a substantially identical profile as the second section of the aperture profile of each faceplate aperture.

8. The semiconductor processing chamber faceplate of claim 7, wherein the faceplate is substantially planar across the first surface about the central axis.

9. The semiconductor processing chamber faceplate of claim 7, wherein the aperture profile of each faceplate aperture includes a taper extending from the second surface.

10. The semiconductor processing chamber faceplate of claim 9, wherein the taper extends to a depth partway through the thickness of the faceplate, and wherein the profile of each faceplate aperture transitions to a choke from the taper.

11. The semiconductor processing chamber faceplate of claim 10, wherein the aperture profile of each faceplate aperture transitions from the choke to a substantially cylindrical profile extending to the first surface.

12. The semiconductor processing chamber faceplate of claim 10, wherein the profile of the central recess is identical to the taper of the aperture profile of each faceplate aperture.

13. The semiconductor processing chamber faceplate of claim 12, wherein the profile of the central recess transitions to a substantially cylindrical profile extending to a location less than the thickness of the faceplate.

14. The semiconductor processing chamber faceplate of claim 7, wherein the central recess extends less than halfway through the thickness of the faceplate from the second surface.

15. A method of semiconductor processing comprising:
flowing a precursor into a processing chamber, wherein the processing chamber comprises a faceplate and a substrate support on which a substrate is disposed, wherein a processing region of the processing chamber is at least partially defined between the faceplate and the substrate support,
wherein the faceplate defines:
a first surface and a second surface opposite the first surface, wherein:
the faceplate is characterized by a central axis extending through the first surface and the second surface,
the faceplate defines a plurality of faceplate apertures through the faceplate, and the faceplate defines a central recess along the central axis and extending from the second surface of the faceplate to a depth less than a thickness of the faceplate, and wherein the central recess defines a blind hole; and wherein each faceplate aperture comprises an aperture profile characterized by a first section extending from the first surface to a position partially through the faceplate, and further characterized by a second section extending from the position partially through the faceplate to the second surface, wherein the central recess is characterized by a substantially identical profile as the second section of the aperture profile of each faceplate aperture;

generating a plasma of the precursor within the processing region of the processing chamber;

depositing a material on the substrate.

16. The method of semiconductor processing of claim 15, wherein the material deposited is characterized by thickness at a center portion of the substrate less than 10% greater than a thickness at an edge portion of the substrate.

17. The method of semiconductor processing of claim 15, wherein the central recess is characterized by a conical or countersunk profile.

* * * * *